United States Patent [19]

Carlson

[11] 4,067,000
[45] Jan. 3, 1978

[54] REMOTE CONTROL TRANSMITTER WITH AN AUDIBLE BATTERY LIFE INDICATOR

[75] Inventor: David John Carlson, Indianapolis, Ind.

[73] Assignee: RCA Corporation, New York, N.Y.

[21] Appl. No.: 691,188

[22] Filed: May 28, 1976

[51] Int. Cl.² .................... H04Q 9/10; H04B 11/00; G08B 21/00
[52] U.S. Cl. .................... 340/171 R; 340/210; 340/249; 325/392
[58] Field of Search ............... 340/147 R, 148, 171 R, 340/249, 207, 210; 325/64, 133, 392; 343/225

[56] References Cited
U.S. PATENT DOCUMENTS

| | | | |
|---|---|---|---|
| 3,879,717 | 4/1975 | Gruensfelder | 340/249 X |
| 3,909,722 | 9/1975 | Bennett, Jr. | 340/224 X |
| 3,967,258 | 6/1976 | Bucy, Jr. | 340/224 X |
| 3,987,414 | 10/1976 | Tuma | 340/171 R X |

Primary Examiner—Donald J. Yusko
Attorney, Agent, or Firm—Eugene M. Whitacre; Kenneth R. Schaefer; Peter M. Emanuel

[57] ABSTRACT

A battery powered ultrasonic remote control transmitter for controlling various functions associated with a television receiver, or the like, includes an arrangement for providing an audible indication that the battery voltage has fallen below a desired operating level. In one embodiment, when the battery voltage has fallen below the desired level, the electrical control signal for at least one control function is selectively amplitude modulated by an audio frequency signal before being coupled to the ultrasonic transducer. As a result, when the control function is selected, an operator is given an audible indication that the battery needs recharging or replacement.

7 Claims, 4 Drawing Figures

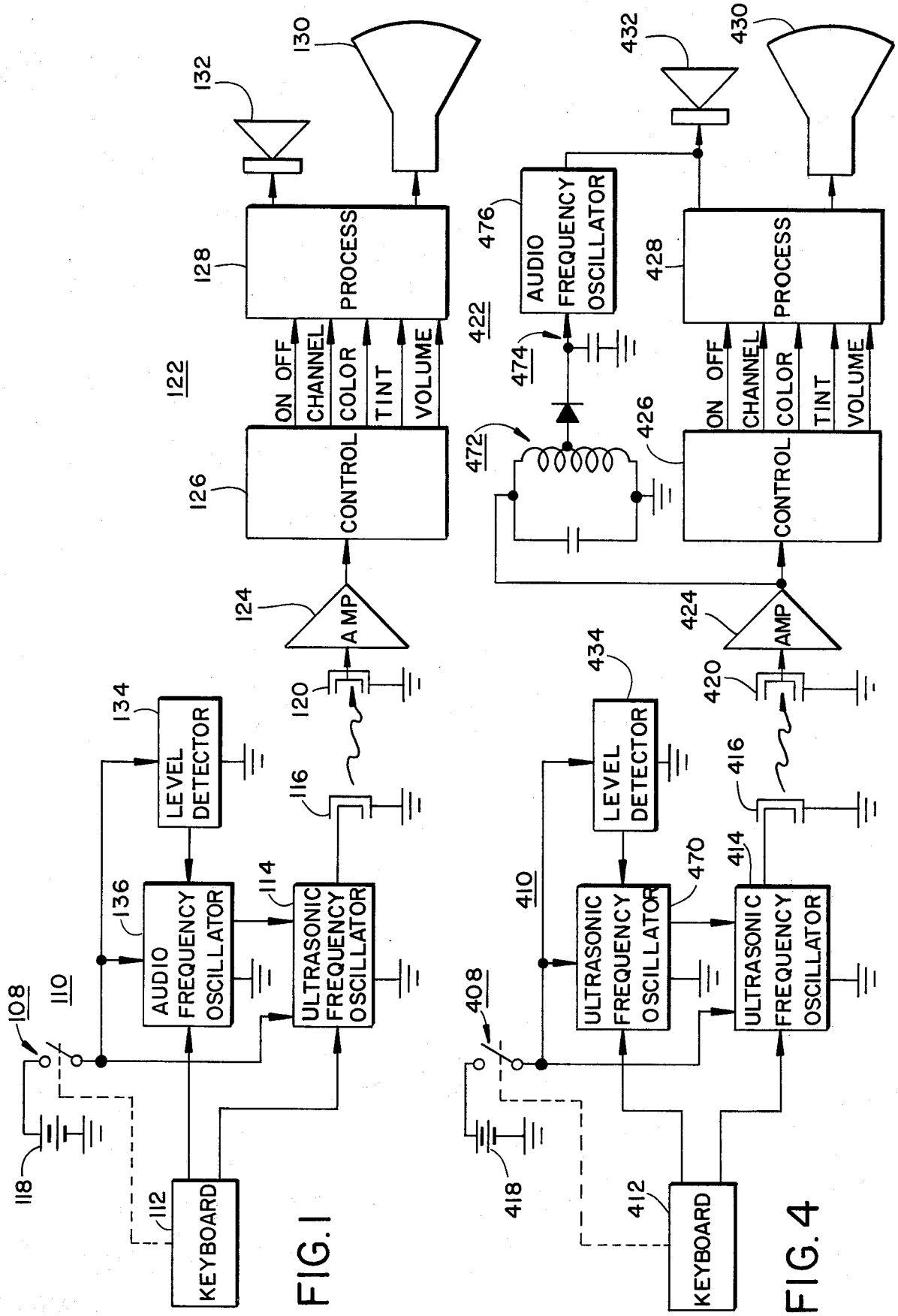

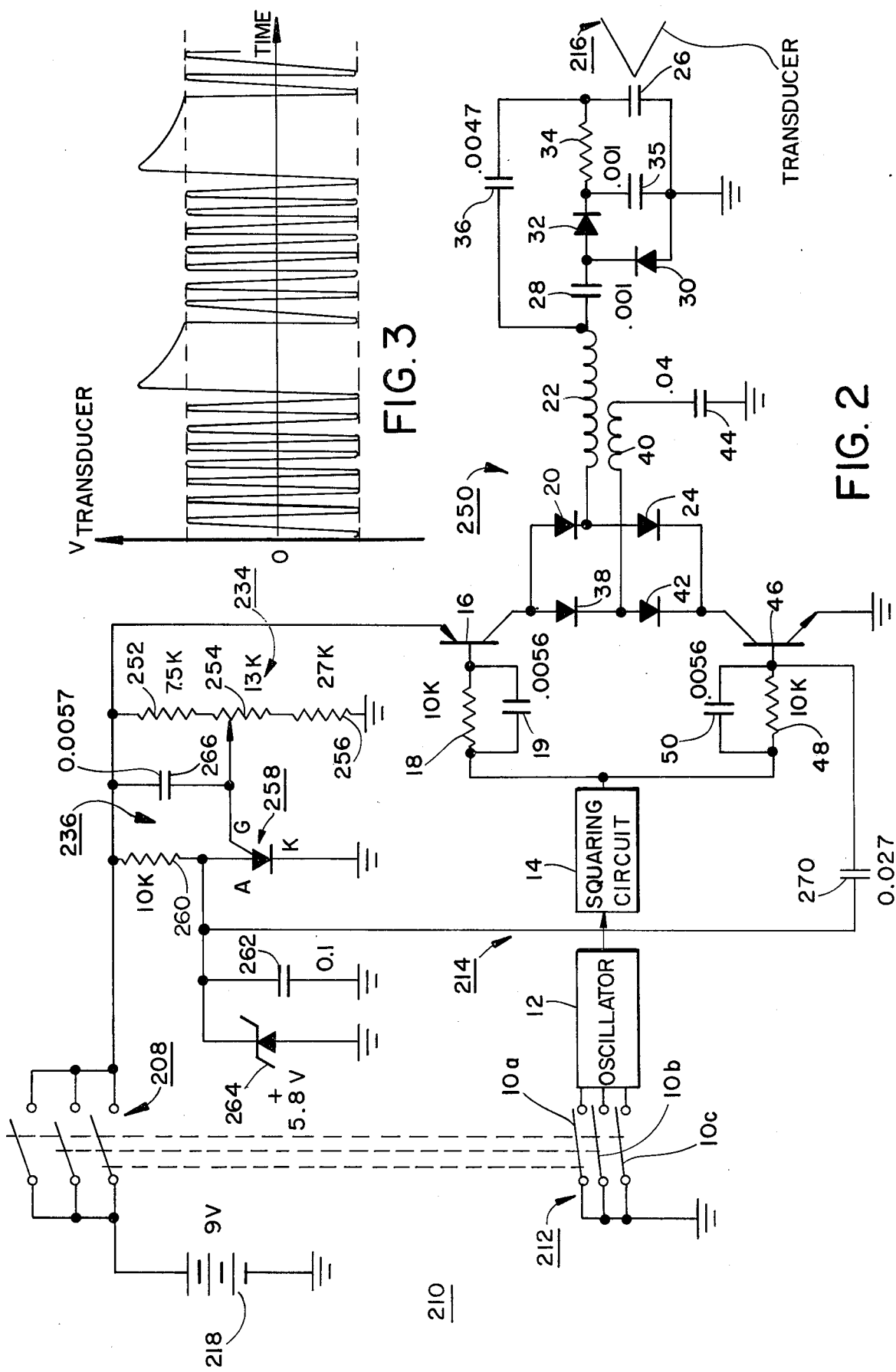

REMOTE CONTROL TRANSMITTER WITH AN AUDIBLE BATTERY LIFE INDICATOR

The present invention relates to the field of battery powered ultrasonic remote control transmitters and is more particularly related to apparatus for providing an indication that the battery voltage has fallen below a desired operating level.

Remote control transmitters for controlling various functions associated with a television receiver have become extremely popular because they allow a viewer to control such functions as on/off, channel, volume, tint and color without leaving his viewing position. In addition to being convenient, such remote control transmitters allow a viewer to optimize the performance of the television receiver with respect to his particular viewing position.

Various types of remote control transmitters are known. The most common type of remote control transmitter includes an ultrasonic transducer which produces an ultrasonic acoustic signal having a frequency above the audible frequency range of human beings in accordance with the function selected. In one type of ultrasonic remote control transmitter, an electrical control signal is coupled to an ultrasonic transducer which converts the electrical energy into sonic energy. By selectively changing the frequency of the control signal, various functions of a television receiver may be controlled. Various types of such ultrasonic control systems are described in U.S. Patent application Ser. No. 580,679 filed May 23, 1975, in the name of John Barrett George entitled, "High Power Remote Control Ultrasonic Transmitter", and assigned to the same assignee as the present applications; "RCA Television Service Data", Files 1975 C-6 and 1975 C-10, published by RCA Corporation, Indianapolis, Ind.; and in "XL-100 Color Television Training Manual for the CTC-74 and CTC-81 Chassis", also published by RCA Corporation, Indianapolis, Ind.

In ultrasonic remote control transmitters which utilize electric control signals, it is desirable to provide an indication of when the operating supply voltage, e.g., the battery voltage, is at a level below which the transmitter will no longer reliably perform. Presently, in one type of battery life indicator, a light emitting diode (LED) is coupled to a voltage sensing circuit which monitors the battery voltage. When the magnitude of the battery voltage falls below a predetermined level, the LED is energized to give a visible indication that the battery needs replacement or recharging.

Unfortunately, the human condition is such that a viewer may ignore this visible indication that the battery needs attention. For the most part, this would cause an inconvenience in that the viewer would not be able to remotely control his television receiver but would rather have to manually operate it. However, some receivers can only be remotely controlled (that is, cannot be manually operated at the receiver itself). Therefore, it is highly desirable that an operator be informed that the battery associated with the remote control transmitter needs replacement in a manner which will insure that the battery is replaced or recharged before it is too late.

In accordance with the present invention, a remote control transmitter includes means by which an audible indication is provided when its supply voltage is nearing a desired operating level below which the transmitter will no longer operate reliably.

In accordance with another feature of the present invention, an ultrasonic remote control transmitter includes means by which at least one electrical signal representing a predetermined remote control function is selectively amplitude modulated by an audio signal before it is coupled to the ultrasonic transducer when the supply voltage is at a predetermined level. In this manner, the same transducer which is utilized to provide ultrasonic signals for the remote control function also provides an audible indication whenever the magnitude of the supply voltage has neared a level below which the remote control transmitter will no longer operate reliably.

These and other features of the present invention may best be understood by reference to the following detailed description and accompanying drawing, in which:

FIGS. 1 and 4 show partially in schematic form and partially in block diagram form ultrasonic remote control transmitter arrangements including audible battery life indicators:

FIG. 2 shows partially in schematic form and partially in block diagram form an implementation of the arrangement of FIG. 1; and FIG. 3 shows a graphical representation of a waveform useful in understanding the implementation shown in FIG. 2.

In the remote control system for a color television receiver of FIG. 1, a remote control transmitter 110 includes a control keyboard 112. Keyboard 112 may be arranged, for example, in a calculator format including keys for the decimal digits 0 to 9 by which a viewer may select a channel by sequentially depressing the keys corresponding to the two digits of the desired channel number. Keyboard 112 may also include function selection keys for providing on/off, volume, brightness, color and tint control.

When a particular key on keyboard 112 is depressed, a corresponding electrical path between keyboard 112 and an ultrasonic frequency oscillator 114 is closed. Simultaneously, a switch 108 is closed thereby coupling battery 118 to ultrasonic frequency oscillator 114. In response, ultrasonic frequency oscillator 114 generates an electrical signal having a particular ultrasonic frequency in accordance with the function selected.

The output signal of ultrasonic frequency oscillator 114 is coupled to an ultrasonic transducer 116. Ultrasonic transducer 116 may comprise a capacitive type of ultrasonic transducer including a piezoelectric material which is mechanically stressed in accordance with the voltage applied across its terminals to provide an acoustic signal.

Acoustic ultrasonic signals propagated by ultrasonic transducer 116 are coupled to a receiving transducer 120 mounted on a television receiver 122 which reconverts them to an electrical signal. The electrical signal is amplified by an amplifier 124 and coupled to a control unit 126. Control unit 126 includes frequency sensitive circuits to decode the amplified electrical signal to provide another electrical signal to control, for example, the on/off, channel, volume, color or tint function of the receiver. The control signal is coupled to the appropriate portion of a signal processing unit 128 to control the image produced on a kinescope 130 or the sound produced by a speaker 132.

The remote control system thus far described may be of the type described in Chapter 8 of the aforementioned RCA "XL-100 Color Television Training Manual".

The combination of a level detector 134 and an audio frequency oscillator 136 provides an indication that the magnitude of the battery voltage has fallen to a level below which the operation of the remote control system may not be reliable. Both level detector 134 and audio frequency oscillator 136 are coupled to battery 118 when switch 108 is closed in response to the selection of a function via keyboard 112. Level detector 134 monitors the magnitude of the battery voltage. When the magnitude of the battery voltage falls below the predetermined level, level detector 134 couples a signal representing this occurrence to audio frequency oscillator 136. In response, audio frequency oscillator 136 generates an audio frequency signal which is coupled to ultrasonic frequency oscillator 114. The audio frequency signal is combined with the ultrasonic frequency signal generated by ultrasonic frequency signal oscillator 114 to form a signal comprising an ultrasonic frequency carrier amplitude modulated by an audio frequency signal.

The amplitude modulated carrier is converted by transducer 116 to an acoustic signal. When the ultrasonic frequency carrier component is received by transducer 120 of receiver 122, it is decoded to control the selected function in the manner described above. Simultaneously, the audio frequency envelope component is converted by transducer 116 into an audible audio frequency acoustic signal. As a result, a viewer is effectively warned that battery 118 needs attention. An audible indication of battery life is particularly desirable in a receiver arrangement of the type such as is described in the aforementioned "XL-100 Color Television Training Manual" wherein there is no means of control of the receiver other than by a remote control unit.

In the implementation of the remote control transmitter of FIG. 1 shown in FIG. 2, certain elements are identified by three digit reference numbers. These elements correspond to elements of the system of FIG. 1 identified by three digit reference number having the same two least significant digits. In remote control unit 210 of FIG. 2, keyboard 212 comprises three single-pole, single-throw switches. Each switch corresponds to a particular function. It should be appreciated that more switches, dependent upon the number of additional functions desired, may be added. Furthermore, to increase the life of battery 218, switches 10a, 10b and 10c of keyboard 212 are mechanically coupled to respective switches of switch bank 208 so that power is only supplied to ultrasonic frequency oscillator 214, level detector 234 and audio frequency oscillator 236 when a function has been selected.

An ultrasonic oscillator 214 comprises the cascaded combination of an oscillator 12 for generating signals having ultrasonic frequencies dependent on the function selected, a squaring circuit 14 for amplifying the signals generated by oscillator 12 to form a signal having both positive and negative pulses, and a drive circuit for processing the signals generated by squaring circuit 14 to drive a capacitive type of transducer 216. An ultrasonic oscillator similar to ultrasonic oscillator 114 is described in the aforementioned United States patent application by George and "XL-100 Color Television Training Manual".

Ultrasonic oscillator 214 serves to drive transducer 216 to generate ultrasonic frequency acoustic signals in the following manner. When a viewer depresses one of switches 10a, 10b or 10c to control a particular function, a squared ultrasonic electrical signal having a frequency corresponding to the selected function is coupled to the base of a PNP transistor 16 through a parallel network including a resistor 18 and a capacitor 19 and to the base of an NPN transistor 46 through a parallel network including a resistor 48 and a capacitor 50. Negative-going pulses render PNP transistor 16 conductive thereby allowing transducer 216, schematically represented by a capacitor 26, to be charged through a series path including a diode 20 and an inductor 22. Positive-going pulses render NPN transistor 46 conductive thereby allowing capacitor 26 to be discharged through a series path including a diode 24 and inductor 22. In order to keep the remote control unit compact and lightweight, relatively small batteries providing only relatively small supply voltages, e.g., 9 v.d.c., are utilized. Therefore, in order to develop a sufficiently high voltage across capacitor 26 to optimally bias transducer 216 (during both the negative-going and positive-going pulses), a voltage doubling network, including a capacitor 28, a diode 30, a diode 32, a resistor 34 and a capacitor 35 is utilized. To further increase the voltage developed across capacitor 26, diodes 38 and 42 provide paths to charge and discharge, respectively, a capacitor 44 through an inductor 40. The charging and discharging current flowing through inductor 40 are magnetically coupled to inductor 22 to increase the charging and discharging currents, respectively of capacitor 26 and thereby increase the voltage developed across it. The alternating signal component of the pulse signal generated by squaring circuit 14 is coupled to transducer 216 through a capacitor 36. Transducer 216 is alternately stressed and released, thereby generating an ultrasonic acoustic signal, in accordance with the charging and discharging of capacitor 26.

The audible battery life indicator of remote control transmitter 210 of FIG. 2 includes a level detector 234 comprising the series combination of resistor 252, potentiometer 254 and resistor 256. The wiper arm of potentiometer 254 is coupled to the gate G of a programmable unijunction transistor (PUT) 258.

Programmable unijunction transistor 258 is arranged with passive elements to form a relaxation oscillator comprising audio frequency oscillator 236. A resistor 260 couples the common junction of the switches comprising switch bank 208 to the anode A of PUT 258. The cathode K of PUT 258 is coupled to ground. A capacitor 262 is coupled between the anode A of PUT 258 and ground. A Zener diode 264 is coupled in parallel relationship with capacitor 262 and is poled so as to conduct in its reverse breakdown region when any switch of switch bank 208 is closed. A speed-up capacitor 266 is coupled between the common junction of the switches comprising switch bank 208 and the gate of PUT 258. The output of audio frequency oscillator 236, taken at the anode A of PUT 258, is coupled through capacitor 270 to the base of transistor 46.

In operation, when battery voltage is above a predetermined level, Zener diode 264 is conductive in its reverse breakdown region. As a result, capacitor 262 is bypassed (i.e., current flows through Zener diode 264 rather than through capacitor 262) and is therefore inhibited from charging.

When the battery voltage falls below the predetermined level, Zener diode 264 is rendered nonconductive. As a result, capacitor 262 is charged by the current provided through resistor 260 (which previously flowed through Zener diode 264). Capacitor 262 charges to a voltage level corresponding to the conduction point of PUT 258. The conduction point of PUT 258 is controlled by adjustment of the wiper arm of potentiometer 254.

When the voltage developed at the anode A of PUT 258 reaches a sufficiently high voltage with respect to the voltage developed at the gate G of PUT 258, PUT 258 is rendered conductive, i.e., conducts between its anode A and its cathode K, thereby discharging capacitor 262. When capacitor 262 is sufficiently discharged, PUT 258 is rendered nonconductive and capacitor 262 again begins to charge. Thereafter, the sequence of events described above repeats so that a periodic signal is generated at anode A of PUT 258. The frequency of oscillation of relaxation oscillator 236 is primarily determined by the values of resistor 260 and capacitor 262. The values are desirably selected to provide a readily audible frequency in the audio frequency range. With the values indicated in FIG. 2, frequencies of oscillation in the range of 2–3 KHz are obtainable dependent on the setting of the wiper arm of potentiometer 254. For the values indicated in FIG. 2, the gate voltages to which the wiper of potentiometer 254 should be adjusted for various levels of battery voltage below which it is desired that audio frequency oscillator 236 begins to oscillate are indicated in the following table.

| Battery Voltage (V.D.C.) | Gate Voltage (V.D.C.) |
|---|---|
| 8.5 | 6.35 |
| 8.0 | 6.6 |
| 7.5 | 6.9 |
| 7.0 | 6.3 |
| 6.5 | 7.65 |

The audio frequency signal is capacitively coupled to the base of NPN transistor 46 where it is, in essence, superimposed upon the squared ultrasonic frequency signals generated by squaring circuit 24. Whenever the amplitude of the audio frequency signal is sufficiently low, independent of the amplitude of the squared ultrasonic frequency signal, transistor 46 is rendered nonconductive. As a result, when the battery voltage falls below the predetermined level, the ultrasonic frequency signals coupled to transducer 216 are, in essence, amplitude modulated by the audio frequency signal.

The signal coupled to transducer 216 when the battery voltage has fallen below the predetermined level is indicated in FIG. 3. For purposes of clarity, the ultrasonic frequency carrier is shown as having a lower frequency than it actually has. It is noted that the modulation is asymmetrical with respect to the zero (0) voltage axis. This is so because the audio frequency signal is only coupled to the base of transistor 26. Although the circuit of FIG. 3 may be modified to generate a signal which is symmetrically modulated, the asymmetrical type of modulation has been found to provide sufficient energy to produce an audible acoustic signal.

In the remote control systems of FIGS. 1 and 2, the transducer of the remote control unit is itself utilized to provide an audible indication of battery life. In the remote control system of FIG. 4, the speaker of the receiver, rather than the transducer of the remote control unit, is utilized to provide an audible indication of battery life. Many of the elements of the system of FIG. 4 are similar to corresponding elements of the system of FIG. 1 and these are identified by three digit reference numbers having the same two least significant digits as the three digit reference numbers utilized to identify the elements of FIG. 1. However, audio frequency oscillator 136 of FIG. 1 has been replaced by an ultrasonic frequency oscillator 470 which, however, may be formed in a manner similar to audio frequency oscillator 236. Furthermore, the electrical output of amplifier 424 is coupled to a tuned circuit 472 as well as to control unit 426. The output tuned circuit 472 is coupled to a peak detector 474. The output of peak detector 474 is coupled to an audio frequency oscillator 476 whose output is in turn coupled to speaker 432.

In operation, when a function is selected, if level detector 434 detects that the battery voltage has fallen below a predetermined level, it couples a signal indicative of this occurrence to ultrasonic frequency oscillator 470. In response, ultrasonic frequency oscillator 470 generates a signal having a predetermined frequency in the ultrasonic frequency range which is combined with the ultrasonic frequency signal generated in accordance with the selected function to form a signal comprising a carrier having a frequency indicative of the selected function and an envelope having a frequency indicative of the fact that the battery voltage has fallen below the predetermined value. The modulated carrier is converted to an acoustic signal by transducer 416 and coupled to transducer 420 which reconverts it to an electrical modulated carrier. The modulated carrier is amplified and coupled to control unit 426 which, as does control unit 126 of FIG. 1, derives appropriate control signals in accordance with the frequency of the carrier.

The modulated carrier is also coupled to tuned circuit 472. Tuned circuit 472 is tuned to the frequency of the signal provided by ultrasonic frequency oscillator 470. Thus, if the battery voltage has fallen below the predetermined level, peak detector 474 will generate a relatively high D.C. voltage. In response, audio frequency oscillator 476 is caused to generate an audio frequency signal which is converted to an audible indication that the battery requires attention.

Although the present invention has been described in terms of specific remote control systems shown in FIGS. 1, 2 and 4, it will be appreciated that the present invention may be utilized with other types of remote control systems. For example, the present invention may be utilized with the type of remote control unit described in the aforementioned RCA Television Service Data, File 1975 C-6, wherein functions are controlled by selectively coupling respective capacitors to a resonant circuit which controls the frequency of the ultrasonic signal transmitted by the unit. Furthermore, although an audible indication of battery life has been provided by amplitude modulating an ultrasonic signal, the audible indication signal may alternatively be provided by frequency modulating the ultrasonic signal. These and other variations are contemplated to be within the scope of the present invention.

What is claimed is:

1. A remote control system comprising:
   means for selecting a function to be controlled;
   means for generating an ultrasonic frequency electrical signal in accordance with the function selected;
   means for supplying energy to said ultrasonic frequency electrical signal generating means;

means for detecting when the energy available from said energy supplying means falls below a predetermined level;

means for generating an audio frequency electrical signal when the energy available from said energy supplying means has fallen below said predetermined level; and ultrasonic transducer means for normally generating an inaudible acoustic signal in response to said ultrasonic frequency electrical signal, said audio frequency signal having a predetermined frequency selected so that said ultrasonic transducer means generates an audible acoustic signal in response to said audio frequency electrical signal.

2. The apparatus recited in claim 1 wherein said transducer means includes means to modulate said ultrasonic frequency electrical signal in accordance with said audio frequency electrical signal so that said audible acoustic signal and said inaudible acoustic signal are generated substantially simultaneously.

3. The apparatus recited in claim 2 wherein said ultrasonic frequency electrical signal is amplitude modulated in accordance with said audio frequency electrical signal.

4. The apparatus recited in claim 2 wherein said means for generating said audio frequency electrical signal includes audio frequency oscillator means.

5. The apparatus recited in claim 4 wherein said audio frequency oscillator means includes a relaxation oscillator.

6. The apparatus recited in claim 5 wherein
said energy supplying means includes a battery; and
said relaxation oscillator includes a unijunction transistor having a conduction path and a control electrode for controlling the conduction of said conduction path, a capacitor coupled in parallel relationship with said conduction path, a charging path coupled between said battery and said capacitor, a Zener diode coupled in parallel relationship with said capacitor; and
said means for detecting when the energy available from said energy supplying means has fallen below said predetermined level includes potentiometer means coupled between said battery and said control electrode.

7. The apparatus recited in claim 1 wherein said audible acoustic signal is provided solely when a function is selected.

* * * * *